(12) United States Patent
Akgul et al.

(10) Patent No.: US 9,698,673 B2
(45) Date of Patent: Jul. 4, 2017

(54) METHOD FOR CONTROLLING AN ELECTRONIC CIRCUIT

(71) Applicants: Commissariat è l'Energie Atomique et aux Energies Alternatives, Paris (FR); Université de Montpellier, Montpellier (FR)

(72) Inventors: Yeter Akgul, Fontaine (FR); Edith Beigne, Meaudre (FR); Pascal Benoit, Montpellier (FR); Suzanne Lesecq, Froges (FR); Diego Puschini Pascual, Meylan (FR)

(73) Assignees: Commissariat à l'Energie Atomique et aux Energies Alternatives, Paris (FR); Université de Montpellier, Montpellier (FR)

( * ) Notice: Subject to any disclaimer, the term of this patent is extended or adjusted under 35 U.S.C. 154(b) by 0 days.

(21) Appl. No.: 14/916,233

(22) PCT Filed: Sep. 5, 2014

(86) PCT No.: PCT/FR2014/052205
§ 371 (c)(1),
(2) Date: Mar. 3, 2016

(87) PCT Pub. No.: WO2015/033078
PCT Pub. Date: Mar. 12, 2015

(65) Prior Publication Data
US 2016/0197549 A1 Jul. 7, 2016

(30) Foreign Application Priority Data
Sep. 6, 2013 (FR) ...................... 13 58541

(51) Int. Cl.
*H02M 3/04* (2006.01)
*G06F 1/32* (2006.01)
*H03K 7/06* (2006.01)

(52) U.S. Cl.
CPC .............. *H02M 3/04* (2013.01); *G06F 1/324* (2013.01); *H03K 7/06* (2013.01); *Y02B 60/1217* (2013.01)

(58) Field of Classification Search
CPC ................................... H02M 3/04; H03K 7/06
See application file for complete search history.

(56) References Cited

U.S. PATENT DOCUMENTS

| 6,433,584 B1 * | 8/2002 | Hatae | H03K 19/0016 326/38 |
| 6,774,705 B2 * | 8/2004 | Miyazaki | H03K 19/00384 327/534 |

(Continued)

FOREIGN PATENT DOCUMENTS

| EP | 2241975 A2 | 10/2010 |
| GB | 2445167 A | 7/2008 |
| WO | 2007056705 A2 | 5/2007 |

OTHER PUBLICATIONS

International Search Report filed in PCT/FR2014/052205, dated Nov. 5, 2015; 3 pgs.

(Continued)

*Primary Examiner* — Jeffrey Zweizig
(74) *Attorney, Agent, or Firm* — Moreno IP Law LLC

(57) ABSTRACT

A method for controlling an electronic circuit by means of the first, second and third operating parameters, comprises: determining a range of variation of the third parameter for each value of the first parameter by varying the second parameter, said ranges being different; determining a target value of the third parameter; if the target value is within one of the ranges, operating the electronic circuit by setting the (Continued)

third parameter to the target value; and in the opposite case, selecting the two ranges framing the target value and operating the electronic circuit by consecutively bringing the third parameter into each one of the selected ranges.

13 Claims, 4 Drawing Sheets

(56) References Cited

U.S. PATENT DOCUMENTS

| | | | | |
|---|---|---|---|---|
| 7,417,489 | B2* | 8/2008 | Fujita | G11O 5/147 327/534 |
| 8,063,692 | B2* | 11/2011 | Okano | H03K 19/0016 327/534 |
| 8,884,683 | B1* | 11/2014 | Helms | G06F 1/206 327/534 |
| 2001/0048319 | A1 | 12/2001 | Miyazaki et al. | |
| 2005/0225376 | A1 | 10/2005 | Kin Law | |

OTHER PUBLICATIONS

"Optimization of VDD and VTH for Low-Power and High-Speed Applications"; K. Nose and T. Sakurai; 2000 IEEE; pp. 469-474.

"Dynamic VTH Scaling Scheme for Active Leakage Power Reduction"; C.H. Kim and K. Roy; Proceedings of the 2002 Design, Automation and Test in Europe Conference and Exhibition; 5 pgs.

"Combined Dynamic Voltage Scaling and Adaptive Body Biasing for Lower Power Microprocessors Under Dynamic Workloads"; S. Martin, K. Flautner, T. Mudge and D. Blaauw; ICCAD '02, Proceedings of the 2002 IEEE/ACM International Conference on Computer-Aided Design; 5 pgs.

"Dynamic Soft Error Hardening via Joint Body Biasing and Dynamic Voltage Scaling"; F. Firouzi, A. Yazdanbakhsh, H. Dorosti and S.M. Fakhraie; 2011 14th Euromicro Conference on Digital System Design; 2011 IEEE; pp. 385-392.

"An Asynchronous NOC Architecture Providing Low Latency Service and its Multi-Level Design Framework"; E. Beigné, F. Clermidy, P. Vivet A. Clouard; M. Renaudin; Proceedings of the 11th IEEE International Symposium on Asynchronous Circuits and Systems 2005; 10 pgs.

"Energy Optimal Speed Control of Devices with Discrete Speed Sets"; R. Rao and S. Vrudhula; Proc. of Design Automation Conference, 2005; pp. 901-904.

"Energy Optimal Speed Control of Devices with Discrete Speed Sets"; R. Rao and S. Vrudhula; Proc. of Design Automation Conference, 2005; 8 pgs.

"Delay and Power Monitoring Schemes for Minimizing Power Consumption by Means of Supply and Threshold Voltage Control in Active and Standby Modes"; M. Nomura, Y. Ikenaga, K. Takeda, Y. Nakazawa, Y. Aimoto and Y. Hagihara; IEEE Journal of Solid-State Circuits, vol. 41, No. 4, Apr. 2006; pp. 805-814.

"Integrating Dynamic Voltage/Frequency Scaling and Adaptive Body Biasing Using Test-Time Voltage Selection"; A. Bonnoit, D. Marculescu, S. Herbert, L. Pileggi; ISLPED 09; 10 pgs.

"Embedding Statistical Tests for On-Chip Dynamic Voltage and Temperature Monitoring"; V. Lionel, M. Philippe, L. Suzanne, B. Edith; DAC 2012; pp. 994-999.

"Per-Core DVFS With Switched-Capacitor Converters for Energy Efficiency in Manycore Processors"; R. Jevtic, H.P Le, M. Blagojevic, S. Baily, K. Asanovic, E. Alon and B. Nikolic; IEEE Transactions on Very Large Scale Integration (VLSI) Systems; 2014 IEEE; pp. 1-8.

Written Opinion of the International Searching Authority, International Application No. PCT/FR2014/052205, 10 pages.

* cited by examiner

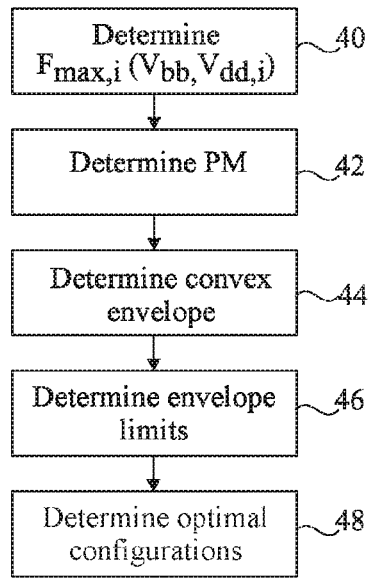
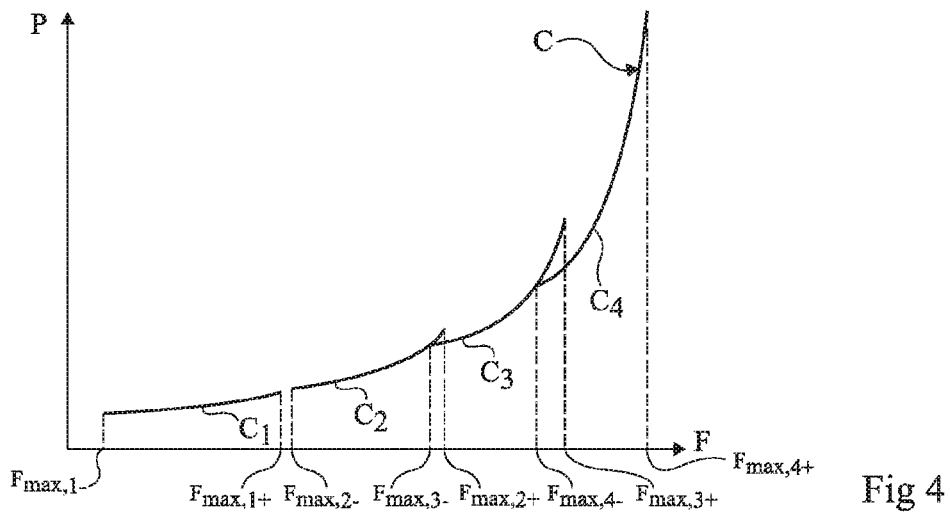
Fig 3
Fig 4
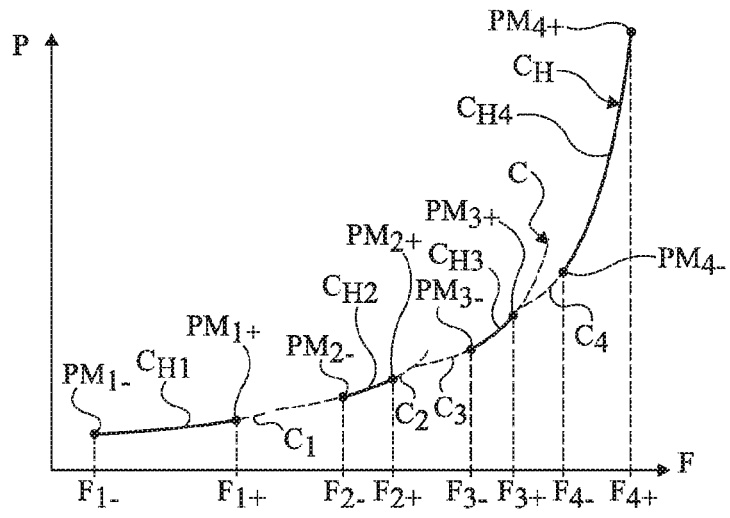
Fig 5

METHOD FOR CONTROLLING AN ELECTRONIC CIRCUIT

The present patent application claims the priority benefit of French patent application FR13/58541 which is herein incorporated by reference.

BACKGROUND

The present application relates to an electronic circuit control method and to an electronic circuit control system.

DISCUSSION OF THE RELATED ART

There exist methods enabling to decrease the electric power consumed by an electronic circuit while keeping the operating performances desired for the electronic circuit. Such methods generally comprise modifying an operating parameter of the electronic circuit, for example, the electronic circuit power supply voltage and/or the clock frequency at which the electronic circuit is rated.

When two operating parameters of the electronic circuit are simultaneously modified to decrease the electric power consumed by the electronic circuit, there exist control methods enabling to determine the values of these parameters for which the consumed power is the lowest possible while achieving the desired operating performances.

The publication entitled "Energy optimal speed control of devices with discrete speed sets" of R. Rao and S. Vrudlhala (Design Automation Conference, 2005, Proceedings—42nd, pp. 901-904, Jun. 13-17, 2005) describes an example of such a control method.

To further decrease the power consumed by the electronic circuit, it is desirable to further modify a third operating parameter of the electronic circuit. An example of a third operating parameter is the bulk bias voltage of metal-oxide field effect transistors, also called MOS transistors, of the electronic circuit.

However, known control methods are not capable of controlling more than two operating parameters of the electronic circuit to decrease the electric power consumed by the electronic circuit while obtaining the desired operating performances. In particular, such control methods generally do not enable to ascertain that the consumed power which results from the determined values of the three operating parameters is substantially the lowest possible.

SUMMARY

Thus, an object of an embodiment is to at least partly overcome the disadvantages of previously-described control methods.

Another object of an embodiment is for the control method to ascertain that the power consumed by the electronic circuit is substantially the lowest possible.

Another object of an embodiment is for the control method to operate in real time.

Thus, an embodiment provides a method of controlling an electronic circuit with first, second, and third operating parameters, comprising the steps of:

(a) determining a variation range of the third parameter for each value of the first parameter by varying the second parameter, said ranges being different;

(b) determining a target value of the third parameter;

(c) if the target value is located in one of the ranges, having the electronic circuit operate by taking the third parameter to the target value; and (d) in the opposite case, selecting the two ranges closest to the target value on either side thereof and having the electronic circuit operate by successively taking the third parameter into each of the two selected ranges.

According to an embodiment, the first parameter takes first discrete values, the second and third parameters continuously varying, each pair of one of the first values of the first parameter and of a second value of the second parameter having an associated third value of the third parameter.

According to an embodiment, the method comprises the steps of:

determining the curve of variation of data representative of the power or of the energy consumed by the electronic circuit according to the third parameter, by varying the second parameter for each first value of the first parameter;

determining the convex or concave envelope of the curve; and extracting said ranges from the envelope.

According to an embodiment, the target value is determined for the execution of a task by the electronic circuit within a given time period.

According to an embodiment, at step (c), the first parameter is taken to the first value corresponding to the range containing the target value and the second parameter is taken to the second value of the pair associated with the target value.

According to an embodiment, the method comprises, at step (d), determining at least one fourth value of the third parameter contained in one of the ranges and smaller than the target value and determining a fifth value of the third parameter contained in one of the ranges and greater than the target value, and the operation of the electronic circuit for a first time period by taking the third parameter to said fourth value, by taking the first parameter to the first value corresponding to the range containing the fourth value and by taking the second parameter to the second value of the pair associated with the fourth value and the operation of the electronic circuit for a second time period by taking the third parameter to said fifth value, by taking the first parameter to the first value corresponding to the range containing the fifth value and by taking the second parameter to the second value of the pair associated with the fifth value.

According to an embodiment, the first parameter is the power supply voltage of the electronic circuit.

According to an embodiment, the second parameter is the bias voltage of metal-oxide field effect transistors of the electronic circuit.

According to an embodiment, the third parameter is the clock frequency at which the electronic circuit is rated.

According to an embodiment, the method is implemented for the control of a plurality of electronic circuits, comprising the steps of:

if the target value is located in one of the ranges of one of the electronic circuits, having said electronic circuit operate by taking the third parameter to the target value; and in the opposite case, selecting one of the electronic circuits and, for said electronic circuit, selecting the two ranges closest to the target value on either side thereof and having said electronic circuit operate by successively taking the third parameter into each of the two selected ranges.

According to an embodiment, the electronic circuit comprises at least two electronic circuit sections, a rank being assigned to each electronic circuit section, and the first parameter is said rank.

Another embodiment provides a system of control of an electronic circuit with first, second, and third operating parameters, the electronic circuit comprising a first unit capable of determining a range of variation of the third parameter for each value of the first parameter by varying the second parameter, said ranges being different, the system comprising a second unit capable of determining a target value of the third parameter, the electronic circuit comprising a third unit capable of taking the third parameter to the target value if the target value is located in one of the ranges and, in the opposite case, selecting the two ranges closest to the target value on either side thereof and successively taking the third parameter into each of the two selected ranges.

Another embodiment provides a method of analyzing an electronic circuit enabling to determine optimal operating configurations of the electronic circuit according to a given performance criterion, each operating configuration of the electronic circuit being defined by values taken by first, second, and third operating parameters, the first parameters being capable of taking first discrete values, the second and third parameters being capable of continuously or discretely varying, the second parameter being capable of varying between a minimum value and a maximum value, each pair of a first value of the first parameter and of a second value of the second parameter having an associated third limiting value of the third parameter beyond which the circuit is likely to longer operate, the method comprising the steps of:
 a) determining, for each value of the first parameter, a limiting variation range of the third parameter by varying the second parameter between the minimum and maximum values of this second parameter and by searching the third corresponding limiting values of the third parameter; and
 b) determining, for each value of the first parameter, an optimal variation range of the third parameter corresponding to all or part of said limiting variation range of the third parameter previously determined for the value of the first considered parameter, so that the optimal variation ranges retained for the different values of the first parameter are all different.

According to an embodiment, the method further comprises an additional step c) between steps a) and b), step c) comprising determining a curve of variation of data representative of said performance criterion according to the third parameter, by defining, for each first value of the first parameter, an arc of a curve corresponding to the values of said representative data obtained over the limiting variation range of the third parameter associated with the first considered parameter and the corresponding variation range of the second parameter and, at step b), for each value of the first parameter, an optimal variation range of the third parameter corresponding to all or part of said limiting variation range of the third parameter previously determined for the value of the first considered parameter is determined, so that the optimal variation ranges retained for the different values of the first parameter are all different and so that the portions of arc of a curve associated with the retained optimal variation ranges meet at best the performance criterion of the electronic circuit for the corresponding values of the third parameter.

According to an embodiment, step c) comprises the steps of:
 determining the convex or concave envelope of said variation curve (C); and
 searching for the portions of said limiting variation ranges of the third parameter which correspond to said envelope and retaining these portions as optimal variation ranges.

Another embodiment provides an electronic circuit control method enabling to determine an optimal operating configuration of the electronic circuit according to a given performance criterion, each operating configuration of the electronic circuit being defined by given values of first, second, and third operating parameters, the first parameter being capable of taking first discrete values, the second and third parameters being capable of varying continuously or discretely, the electronic circuit comprising means for storing information previously obtained by the analysis method such as previously defined and comprising, for each value of the first parameter, an optimal variation range of the third parameter associated with a corresponding range of values of the second parameter, the optimal variation ranges all being different, the electronic circuit comprising analysis means enabling, for each pair of one of the first values of the first parameter and of a second value of the second parameter, to associate therewith a third value of the third parameter, the method comprising the steps of:
 d) determining a target value of the third parameter;
 e) if the target value is located in one of the optimal variation ranges of the third parameter, selecting this optimal variation range and having the electronic circuit operate by taking the third parameter to the target value; and
 f) in the opposite case, selecting the two optimal variation ranges of the third parameter closest to the target value on either side thereof and having the electronic circuit operate by successively taking the third parameter into each of the two selected optimal variation ranges, between a lower value and an upper value of the third parameter on each side of the target value; and
at steps e) or f), the first parameter is taken to the first value corresponding to the range containing the third applied value and the second parameter is taken to the second value of the pair associated with the third applied value.

According to an embodiment, said given performance criterion is an energetic criterion, such as power or energy, and the third parameter is representative of a time performance criterion, such as the operating frequency of the electronic circuit.

According to an embodiment, the target value is determined for the execution of a task by the electronic circuit within a given time period.

According to an embodiment, the method comprises, at step f), a first operation of the electronic circuit for a first time period by taking the third parameter to said lower value, and a second operation of the electronic circuit for a second time period by taking the third parameter to said upper value, the first and second operations being alternately repeated.

According to an embodiment, the first parameter is the power supply voltage of the electronic circuit, the second parameter is the bias voltage of metal-oxide field effect transistors of the electronic circuit, and the third parameter is the clock frequency at which the electronic circuit is rated.

Another embodiment provides a method of controlling a plurality of electronic circuits, comprising the steps of:
 if the target value is located in one of the ranges of one of the electronic circuits, having said electronic circuit operate by taking the third parameter to the target value; and in the opposite case, selecting the one of the electronic circuits and, for said electronic circuit, selecting the two ranges closest to the target value on either side thereof and having said electronic circuit operate by successively taking the third parameter into each of the two selected ranges.

According to an embodiment, the electronic circuit comprises at least two electronic circuit sections, a rank being assigned to each electronic circuit section, and the first parameter is said rank.

Another embodiment provides an electronic circuit comprising:
  actuators enabling to control the values of first, second, and third parameters defining an operating configuration of the electronic circuit, the first parameter being capable of taking first discrete values, the second and third parameters being capable of continuously or discretely varying;
  a first unit comprising means for storing previously-obtained information according to the above method and comprising, for each value of the first parameter, an optimal variation range of the third parameter associated with a corresponding range of values of the second parameter, the optimal variation ranges all being different, and comprising analysis means connected to the storage means and enabling to associate a third value of the third parameter to each pair of one of the first values of the first parameter and of a second value of the second parameter;
  a second unit capable of determining a target value of the third parameter;
  a third analysis unit capable of determining whether the target value is located in one of the optimal variation ranges, and of selecting this range in the case where it is and, in the opposite case, of selecting the two ranges closest to the target value on either side thereof, the analysis unit defining, according to the case, one or two operating configurations with a third parameter respectively having the target value or two values respectively smaller and greater than said target value and respectively contained in the two selected ranges, for each configuration the first parameter taking a first value corresponding to the range containing the value of the third parameter and the second parameter taking the second value of the pair associated with the third retained value; and
  a fourth control unit capable of applying, via said actuators, an operating configuration or as a variation, each of the two operating configurations defined by the third analysis unit.

According to an embodiment, the first unit comprises means for implementing the analysis method such as previously defined enabling to define said information stored by said storage means.

BRIEF DESCRIPTION OF THE DRAWINGS

The foregoing and other features and advantages will be discussed in detail in the following non-limiting description of specific embodiments in connection with the accompanying drawings, among which:

FIG. 3 shows, in the form of a block diagram, an embodiment of a method of determining minimum power operating configurations of the electronic circuit of FIG. 1;

FIG. 4 shows an example of a curve of variation of the power consumed by the electronic circuit of FIG. 1 according to the clock frequency during variations of the power supply voltage and of the bulk bias voltage of MOS transistors of the electronic circuit;

FIG. 5 shows an example of a convex envelope of the variation curve of FIG. 4;

DETAILED DESCRIPTION

Figure 1:
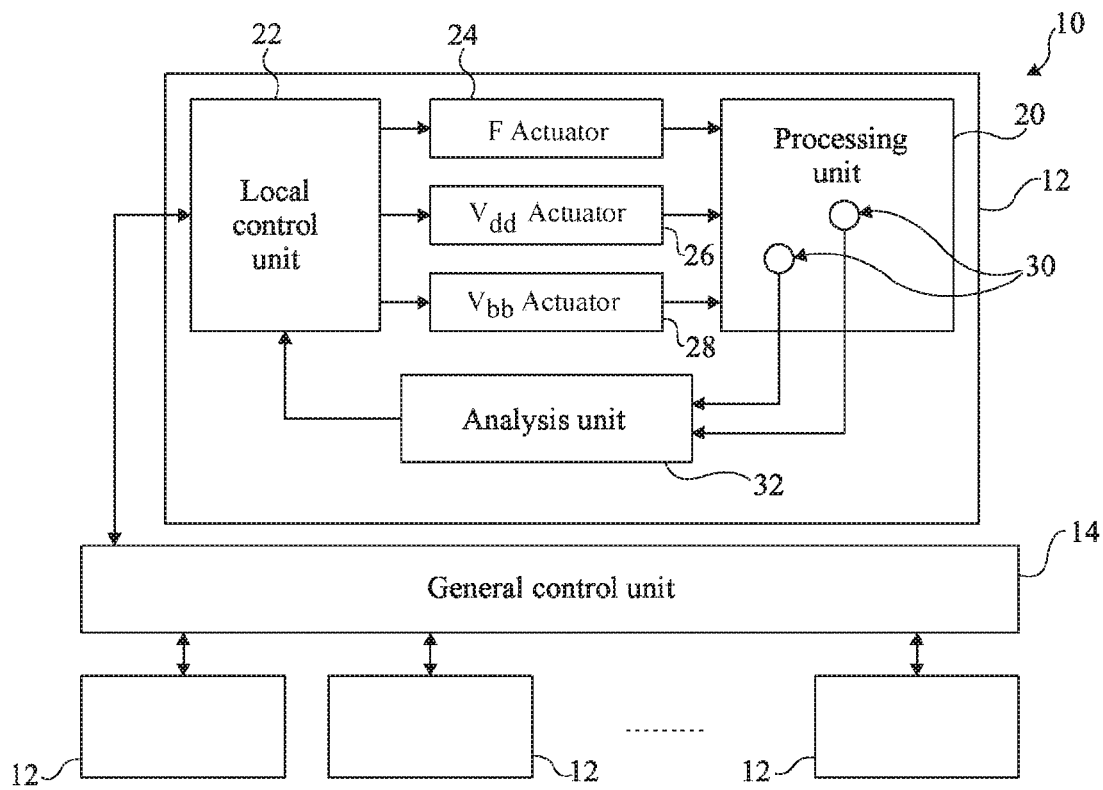
FIG. 1 partially and schematically shows an embodiment of an electronic circuit.

For clarity, the same elements have been designated with the same reference numerals in the various drawings and, further, the various drawings are not to scale. Further, in the following description, unless otherwise indicated, terms "substantially", "approximately", and "in the order of" mean "to within 10%".

According to an embodiment, the control method comprises modifying three operating parameters of an electronic circuit enabling to achieve the desired operating performances of the electronic circuit with substantially the lowest possible consumed power, where at least one of the operating parameters can only take discrete values while the other operating parameters may vary continuously or discretely with a fine pitch, or discretely.

Preferably, at least one of the operating parameters of the electronic circuit is representative of the operating speed of the electronic circuit. It may be the clock frequency at which the electronic circuit is rated.

An embodiment will now be described in detail, where the three operating parameters of the electronic circuit are the electronic circuit power supply voltage, the clock frequency, and the bias voltage of bulks of MOS transistors of the electronic circuit. As an example, in this embodiment, the discretely-varying operating parameter is the power supply voltage.

FIG. 1 shows an embodiment of an electronic circuit 10.

Electronic circuit 10 comprises a plurality of unit electronic circuits 12, for example, from 1 to 64 circuits 12. Circuits 12 are capable of operating in parallel. Each unit electronic circuit 12 is connected to a general control unit 14 capable, in particular, of allocating the tasks to be performed to the different circuits 12. General control unit 14 may be formed in centralized or distributed fashion in electronic circuit 10. According to an embodiment, general control unit 14 may comprise a processor capable of executing the instructions of a computer program stored in a memory.

According to an example, general control unit 14 may be formed by a dedicated circuit, for example, in the form of a state machine.

According to an embodiment, at least one of circuits 12 may be powered at a power supply voltage $V_{dd}$, which may be different from the power supply voltages of the other unit electronic circuits 12. Preferably, each circuit 12 may be powered at a power supply voltage $V_{dd}$, which may be different from the power supply voltages of the other unit electronic circuits.

According to an embodiment, at least one of circuits 12 is a synchronous electronic circuit or a locally synchronous electronic circuit, which may be rated by a clock frequency F which may be different from the clock frequencies rating the other unit electronic circuits 12. Preferably, each circuit 12 may be rated at a clock frequency F, which may be different from the clock frequencies rating the other unit electronic circuits 12.

According to an embodiment, at least one of circuits 12 comprises MOS transistors and bulk bias voltage $V_{bb}$ of the MOS transistors of circuit 12 may be modified. Preferably, all circuits 12 comprise MOS transistors and the bulk bias voltage of the MOS transistors of each circuit 12 may be different from the bias voltages of the other unit electronic circuits 12.

The structure of one of unit electronic circuits 12 will now be described. A plurality of unit electronic circuits 12 may have a similar structure.

At least one of unit electronic circuits 12 comprises a processing unit 20 capable, in particular, of performing calculations. It may be a dedicated electronic circuit or a processor capable of executing the instructions of a computer program stored in a memory. Processing unit 20 is powered with power supply voltage $V_{dd}$. The bulks of at least some MOS transistors of processing unit 20 are biased to bias voltage $V_{bb}$. Processing unit 20 is rated at clock frequency F. Processing unit 20 is capable of executing the tasks assigned to circuit 12 by general control unit 14.

Unit electronic circuit 12 comprises a local control unit 22 capable of controlling at least three actuators 24, 26, 28. First actuator 24 is capable of modifying frequency F. Second actuator 26 is capable of modifying power supply voltage $V_{dd}$. According to an example, actuator 26 may comprise a DC/DC converter controlled by unit 22. According to another example, actuator 26 corresponds to a $V_{dd}$ hopping circuit. Third actuator 28 is capable of modifying bias voltage $V_{bb}$. Third actuator 28 may comprise a charge pump circuit.

Unit electronic circuit 12 may comprise sensors 30, for example, arranged in processing unit 20. One of sensors 30 may correspond to a sensor providing a signal representative of temperature T in processing unit 20. One of sensors 30 may correspond to a sensor providing a signal representative of temperature A in processing unit 20. Activity A of circuit 12 is for example an information representative of the number of logic gates which switch within a defined time interval or the number of transitions of the MOS transistors of processing unit 20 for the task being executed. One of sensors 30 may correspond to a sensor providing a signal representative of power P consumed by processing unit 20.

Unit electronic circuit 12 may comprise an analysis unit 32 receiving the signals provided by sensors 30. Analysis unit 32 is capable of providing data representative of operating configurations likely to be applied by control unit 22. Such configurations are called optimal configurations hereafter. These are operating configurations of circuit 12 where a parameter representative of the electric power consumption of circuit 12 is minimum or substantially minimum. This parameter for example corresponds to the electric power consumed by circuit 12 or to the electric energy used by circuit 12 for the execution of a task.

According to a variation, it is possible for temperature T not to be directly measured. Temperature T can then be determined by analysis unit 32 based on signals provided by circuits 12 neighboring the considered circuit. According to a variation, it is possible not to directly measure activity A, which may be estimated by analysis unit 32. According to a variation, it is possible not to directly measure consumed power P. Power P may then be estimated by analysis unit 32. Consumed power P may be estimated from the measurement of temperature T, of activity A, or power supply voltage $V_{dd}$, and of bias voltage $V_{bb}$. Consumed power P can be divided into a dynamic power $P_{dyn}$ and a leakage power $P_{leak}$. Dynamic power $P_{dyn}$ is the consumed power due to the energy dissipated during state switchings of the logic gates or during switchings between the on state and the off state of the MOS transistors. Leakage power $P_{leak}$ is the consumed power due to the various losses of transistors other than dynamic power $P_{dyn}$. Analysis unit 32 may determine an estimate of dynamic power $P_{dyn}$ by a mathematical function of frequency F, of activity A, and of power supply voltage $V_{dd}$. Analysis unit 32 may determine an estimate of leakage power $P_{leak}$ by a mathematical function of frequency F, of power supply voltage $V_{dd}$, of temperature T, and of bias voltage $V_{bb}$.

According to an embodiment, power supply voltage $V_{dd}$ may take N discrete values $V_{dd,i}$, N being an integer for example varying from 2 to 5 and i being an integer varying from 1 to N. Bias voltage $V_{bb}$ may vary continuously or discretely with a fine pitch, between a minimum value $V_{bb,min,i}$ and a maximum value $V_{bb,max,i}$, where the two values may depend on $V_{dd,i}$.

Parameters $V_{dd}$, $V_{bb}$, and F depend on one another. Indeed, for a given pair of voltages $V_{dd}$ and $V_{bb}$, there exists a maximum value $F_{max}$ of the clock frequency beyond which time errors may occur. A time error for example occurs when the input signal of at least one flip-flop is not established within a clock period. Generally, circuit 12 is rated at maximum frequency $F_{max}$, possibly by applying a security margin, which is allowed by the values of voltages $V_{dd}$, $V_{bb}$ applied to circuit 12.

In operation, electronic circuit 12 is led to perform a succession of tasks. A performance constraint is associated with the execution of each task. This means that the execution of the tasks should be over at latest at the end of a determined time period. A possibility comprises having circuit 12 operate at a constant target clock frequency $F_{target}$, which is the clock frequency for which the execution of the task is over at the end of the determined time period. Another possibility is to have the circuit operate successively at different clock frequencies so that the execution of the task is over at the end of the determined time period. The time performances of circuit 12 are then equivalent to an operation at target clock frequency $F_{target}$. Target clock frequencies $F_{target}$ of successive tasks may vary from one task to the other.

For each value of power supply voltage $V_{dd,i}$, where i varies from 1 to N, the maximum accessible clock frequency $F_{max}$ at which the electronic circuit can be rated varies within range [$F_{max,i-}$, $F_{max,i+}$] when bias voltage $V_{bb}$ varies from $V_{bb,min,i}$ to $V_{bb,max,i}$.

Figure 2:
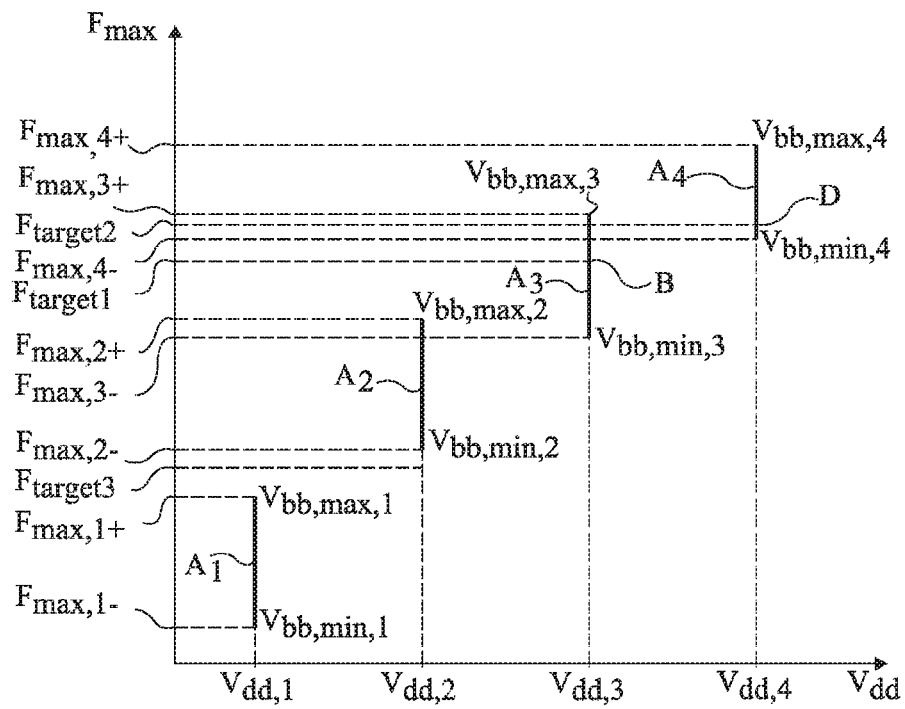
FIG. 2 shows an example of maximum clock frequencies accessible according to the power supply voltage and to the bulk bias voltage of MOS transistors of the electronic circuit of FIG. 1.

FIG. 2 shows an example of the maximum clock frequencies $F_{max}$ which may be achieved for all possible pairs ($V_{dd}$, $V_{bb}$) in the case where power supply voltage $V_{dd}$ may take four values $V_{dd1}$, $V_{dd2}$, $V_{dd3}$, or $V_{dd4}$ and in the case where bias voltage $V_{bb}$ may vary from $V_{bb,min,i}$ to $V_{bb,max,i}$, where i varies from 1 to 4. A single pair of voltages ($V_{dd}$, $V_{bb}$) corresponds to a point of one of segments $A_1$, $A_2$, $A_3$, or $A_4$.

Consider three target clock frequencies $F_{target1}$, $F_{target2}$, and $F_{target3}$. As appears in FIG. 2, a single point B of one of segments $A_1$, $A_2$, $A_3$, and $A_4$ corresponds to target clock frequency $F_{target1}$. This means that target clock frequency $F_{target1}$ is only accessible with a single pair of voltages ($V_{dd}$, $V_{bb}$). To decrease the electric power consumption of circuit 12, it may be envisaged to apply voltages $V_{dd}$ and $V_{bb}$ associated with point B and to rate the circuit at target clock frequency $F_{target1}$. However, this does not ascertain that the power consumed by circuit 12 is minimum and that there exists no other solution for which the consumed power would be lower for the same performance as that associated with point B.

Two points C and D of two different segments, $A_3$ and $A_4$, correspond to target clock frequency $F_{target2}$. Target clock frequency $F_{target2}$ is thus accessible by two pairs of voltages ($V_{dd}$, $V_{bb}$). A problem is to select the pair of voltages ($V_{dd}$, $V_{bb}$) to be used. It is however not ascertained that the power consumed by the circuit is minimum for one or the other of these pairs of voltage.

No point of segments $A_1$, $A_2$, $A_3$, and $A_4$ corresponds to target clock frequency $F_{target3}$. A possibility would then be to rate the circuit at an accessible clock frequency higher than target clock frequency $F_{target3}$. However, the power consumed by the circuit then is not minimum. Another possibility would be to have circuit 12 successively operate at a clock frequency $F_{inf}$ lower than target clock frequency $F_{target3}$ and at a clock frequency $F_{sup}$ higher than target clock frequency $F_{target3}$ or conversely. The problem then is to select the pairs of voltages ($V_{dd}$, $V_{bb}$) to be used for frequencies $F_{inf}$ and $F_{sup}$ so that the consumed power is minimum.

According to an embodiment, a method of determining the operating configurations of circuit 12 for which the power consumed by circuit 12 is minimum, or substantially minimum, while reaching the desired performances, is implemented. Such operating configurations will be called optimal configurations. Each optimal configuration corresponds to a triplet comprising a value of voltage $V_{dd}$, a value of voltage $V_{bb}$, and a corresponding maximum clock frequency value $F_{max}$.

The method of determining the optimal configurations may be implemented on design of electronic circuit 10 or during a step of characterization of electronic circuit 10 after manufacturing thereof. In this case, data representative of the optimal configurations may be stored in a memory of analysis unit 32. As a variation, the method of determining the optimal configurations may be implemented by analysis unit 32 during the operation of electronic circuit 10.

According to an embodiment, in operation, a control method comprising selecting the optimal configuration or two optimal configurations to be applied to achieve the desired performances and controlling the actuators to apply the selected optimal configuration or the selected optimal configurations is implemented.

FIG. 3 shows in the form of a block diagram an embodiment of the method of determining the optimal configurations.

At step 40, for a determined temperature T and activity A, the set of ranges [$F_{max,i-}$, $F_{max,i+}$] of maximum clock frequency $F_{max,i}$, where i varies from 1 to N, likely to be obtained by varying power supply voltage $V_{dd}$ among values $V_{dd,i}$ and by varying bias voltage $V_{bb}$ between $V_{bb,min,i}$ and $V_{bb,max,i}$, is determined. Segments $A_1$, $A_2$, $A_3$, and $A_4$ previously described in relation with FIG. 2 show an example of ranges [$F_{max,i-}$, $F_{max,i+}$] of maximum clock frequencies $F_{max,i}$ in the case where N is equal to 4.

As an example, the determination of maximum clock frequency $F_{max,i}$ obtained for a pair of voltages ($V_{bb}$, $V_{dd,i}$) may be achieved via delay sensors in the publication entitled "An innovative timing slack monitor for variation tolerant circuits" of B. Rebaud et al. (IEEE International Conference on IC Design and Technology—ICICDT—2009, pages 215-218, May 18-20, 2009).

The method carries on at step 42.

At step 42, power P consumed by processing unit 20 is determined for each triplet ($F_{max,i}$, $V_{bb}$, $V_{dd,i}$) and for the determined temperature T and activity A. In the following description, call operating point PM the power-clock frequency pair (P, $F_{max,i}$).

FIG. 4 shows an example of a curve C of variation of the consumed power P according to clock frequency F, for a determined temperature T and activity A, in the case where N is equal to 4. Each point of curve C corresponds to an operating point PM. Curve C comprises four arcs $C_1$, $C_2$, $C_3$, and $C_4$. Generally, curve C comprises N arcs $C_i$, with i varying from 1 to N, each arc $C_i$ being obtained with power supply voltage $V_{dd,i}$. For each arc $C_i$, the point of the arc at frequency $F_{max,i-}$, that is, the left-hand end point in FIG. 4, is obtained for bias voltage $V_{bb,min,i}$ and the point of the arc at frequency $F_{max,i+}$, that is, the right-hand end point in FIG. 4, is obtained for bias voltage $V_{bb,max,i}$.

The method carries on at step 44.

At step 44, convex envelope $C_H$ of curve C is determined. Convex envelope $C_H$ is defined, like curve C, for a determined temperature T and activity A. Convex envelope $C_H$ is defined by the following relations (1):

$$C = \bigcup\nolimits_{i=1:N} C_i \qquad (1)$$

$$EF = \bigcup\nolimits_{i=1:N} [F_{max,i-}, F_{max,i+}]$$

$$a_{\in}[0,1] = \left\{ \begin{array}{c} (P_j, F_j) \mid P(aF_a(1-a)F_b) \leq aP(F_a) + (1-a)P(F_b), \\ F_a \neq F_b, (F_a, F_b) \in EF \times EF \end{array} \right\}$$

This means that for two points $PM_a$ and $PM_b$ of convex envelope $C_H$, all the points of the arc of curve $C_H$ between points $PM_a$ and $PM_b$ are located under the line connecting points $PM_a$ and $PM_b$. Convex envelope $C_H$ comprises arcs $C_{Hi}$, with i varying from 1 to N, each arc $C_{Hi}$ corresponding to a portion of arc $C_i$.

It has been shown that if target clock frequency $F_{target}$ corresponds to a frequency $F_{max,i}$ associated with a point PM belonging to convex envelope $C_H$, the consumed power is then minimum. Further, it has been shown that if target clock frequency $F_{target}$ corresponds to a frequency $F_{max,i}$ associated with a point PM which does not belong to convex envelope $C_H$, a minimum consumed power may be obtained by having processing unit 20 successively operate at a frequency $F_{sup}$ greater than $F_{target}$ and at a frequency $F_{inf}$ smaller than $F_{target}$ or conversely, frequencies $F_{sup}$ and $F_{inf}$ being the frequencies closest to $F_{target}$ having points PM of convex envelope $C_H$ corresponding thereto.

The method carries on at step 46.

At step 46, the ends of each arc $C_{Hi}$ of convex envelope $C_H$ are determined.

FIG. 5 shows an example of a convex curve $C_H$ associated with curve C shown in FIG. 4. In FIG. 5, the portions of curve C which do not belong to curve $C_H$ are shown in dotted lines. For each arc $C_{Hi}$, a first end point, noted $PM_{i-}$, corresponds to the point of arc $C_{Hi}$ for which bias voltage $V_{bb}$ is the lowest, noted $V_{bb,i-}$. The maximum frequency of point $PM_{i-}$ is noted $F_{i-}$. The second end point, noted $PM_{i+}$, corresponds to the point of arc $C_{Hi}$ for which bias voltage $V_{bb}$ is the highest, noted $V_{bb,i+}$. The maximum frequency corresponding to point $PM_{i+}$ is noted $F_{i+}$. The method carries on at step 48.

At step 48, the values of triplets $(V_{dd,i}, V_{bb,i-}, F_{i-})$ and $(V_{dd,i}, V_{bb,i+}, F_{i+})$, for i varying from 1 to N, are stored in a memory of analysis unit 32. Further, data representative of the curves of variation of bias voltage $V_{bb,i}$ according to maximum clock frequency $F_{max}$ for each value $V_{dd,i}$ of power supply voltage $V_{dd}$ are stored in a memory of analysis unit 32. All these data correspond to the data representative of the optimal configurations and are associated with a determined temperature T and activity A.

The data representative of the optimal configurations for a determined temperature T and activity A are indicated in table (1) hereafter:

TABLE (1)

| Power supply voltage $V_{dd}$ | PM corresponding to the lower limit | PM corresponding to the upper limit | Bias voltage $V_{bb}$ |
| --- | --- | --- | --- |
| $V_{dd, 1}$ | $V_{bb, 1} - (T, A)$, $F_1 - (T, A)$ | $V_{bb, 1} + (T, A)$, $F_1 + (T, A)$ | $V_{bb, 1}(F_{max}, T, A)$ |
| $V_{dd, 2}$ | $V_{bb, 2} - (T, A)$, $F_2 - (T, A)$ | $V_{bb, 2} + (T, A)$, $F_2 + (T, A)$ | $V_{bb, 2}(F_{max}, T, A)$ |
| . | . | . | . |
| . | . | . | . |
| . | . | . | . |
| $V_{dd, N}$ | $V_{bb, N} - (T, A)$, $F_N - (T, A)$ | $V_{bb, N} + (T, A)$, $F_N + (T, A)$ | $V_{bb, N}(F_{max}, T, A)$ |

Figure 6:
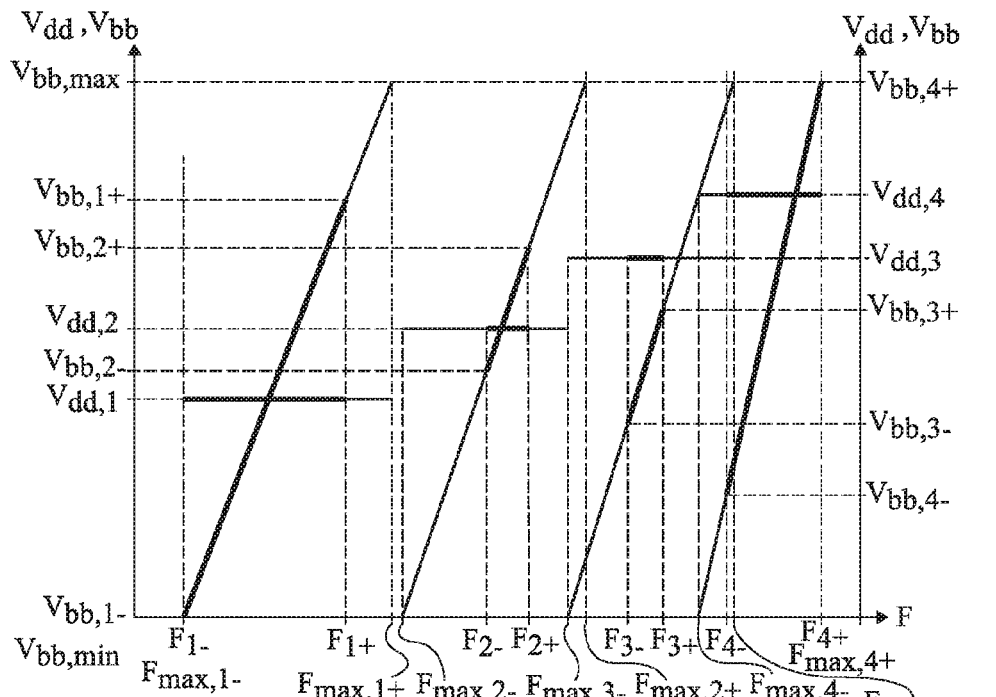
FIG. 6 shows variation curves, according to the clock frequency, of the power supply voltage and of the bulk bias voltage of MOS transistors of the electronic circuit of FIG. 1.

FIG. 6 shows the curves of variation, according to the clock frequency, of power supply voltage $V_{dd}$ and of bias voltage $V_{bb}$ for a determined temperature T and activity A, obtained from the example of convex envelope of FIG. 5. These curves illustrate the data representative of the optimal configurations.

According to an embodiment, previously-described steps 40 to 48 are repeated a plurality of times for a plurality of values of temperature T and/or a plurality of values of activity A. For each value of temperature T and/or of activity A, the data representative of the optimal configurations are stored in the memory of analysis unit 32.

According to another embodiment, previously-described steps 40 to 48 are carried out by analysis unit 32 in operation. Analysis unit 32 determines points PM based on values of temperature T and activity A determined from the signals provided by sensors 30. In the case of a variation of temperature T or of activity A, analysis unit 32 may determine new values of points PM. As an example, it is possible to only determine new values of points PM when temperature T varies beyond a threshold or when activity A varies beyond a threshold.

The determination of convex envelope $C_H$, at previously-described step 42, requires measuring the power consumed by processing unit 20. However, such a measurement may be difficult to perform. According to an embodiment, the determination of frequency ranges $[F_{i-}, F_{i+}]$, with i varying from 1 to N, is performed from the frequency ranges $[F_{max,i-}, F_{max,i+}]$ determined at step 40. As an example, range $[F_{i-}, F_{i+}]$ is equal to range $[F_{max,i-}, F_{max,i+}]$ at which the portions common (possibly with added margins) with another range $[F_{max,j-}, F_{max,j+}]$, where j is an integer different from i, are removed. However, the power consumed over such frequency ranges may possibly not be minimum.

It should be noted that in this simplified embodiment, frequency ranges $[F_{i-}, F_{i+}]$ which are relatively close to those obtained by implementing the entire previously-described method are obtained.

In the previously-described embodiment, the optimal configurations correspond to the configurations for which the power consumed by electronic circuit 12 is minimum. As a variation, instead of using the electric power consumed by processing unit 20, it is possible to consider the electric energy used to carry out the considered task. The optimal configurations then are those for which the energy used is minimum.

In the previously-described embodiment, curve C of variation of the consumed power according to the clock frequency of circuit 12 has been used and convex envelope $C_H$ of curve C has been determined. It should however be clear that the curve of variation of the inverse of the consumed power (or of the inverse of the energy used) may be used. In this case, the concave envelope of the curve of variation of the inverse of the consumed power is used.

Figure 7:
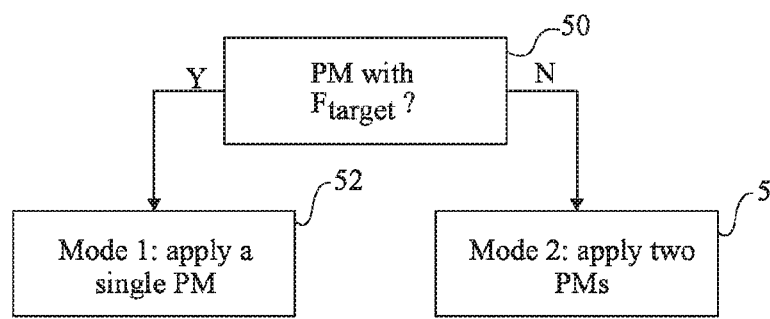
FIG. 7 shows, in the form of a block diagram, an embodiment of a method of controlling the clock frequency, the power supply voltage, and the bulk bias voltage of MOS transistors of the electronic circuit of FIG. 1.

FIG. 7 shows, in the form of a block diagram, an embodiment of the method of controlling power supply voltage $V_{dd}$, bias voltage $V_{bb}$, and clock frequency F of circuit 12.

General control unit 14 provides local control unit 22 of circuit 12 with a signal representative of target clock frequency $F_{target}$ for the task to be executed by circuit 12.

At step 50, analysis unit 32 determines whether target clock frequency $F_{target}$ is between frequencies $F_{i-}$ and $F_{i+}$, for i varying from 1 to N, stored in the memory.

According to an embodiment, data representative of the optimal configurations have been determined and stored in analysis unit 32 for a plurality of temperature values T and a plurality of activity values A.

In the case where analysis circuit 32 is capable of determining, from direct measurements or by estimation, temperature T and activity A of processing unit 20, analysis unit 32 may select frequency values $F_{i-}$ and $F_{i+}$, for i varying from 1 to N, of the data representative of the optimal configurations which have been determined at the temperature closest to the measured/estimated temperature and at the activity closest to the measured/estimated activity. As a variation, analysis unit 32 may determine new data representative of optimal configurations, and thus new values of frequencies $F_{i-}$ and $F_{i+}$, for i varying from 1 to N, by interpolation at the measured/estimated temperature T and at the measured/estimated activity A based on data representative of the optimal configurations which have been determined at the closest temperatures T on either side of the measured/estimated temperature and at the closest activities A on either side of the closest activity.

According to an embodiment, data representative of the optimal configurations have been determined and stored in analysis unit 32 for a single value of temperature T and a single value of activity A. Analysis unit 32 can thus select frequency values $F_{i-}$ and $F_{i+}$, for i varying from 1 to N, stored in the memory of analysis unit 32. As a variation, analysis unit 32 may determined new data representative of optimal configurations, and thus new values of frequencies $F_{i-}$ and $F_{i+}$, for i varying from 1 to N, by interpolation at the measured/estimated temperature T and at the measured/estimated activity A based on data representative of the configurations stored in the memory of analysis unit 32.

It should be noted that whatever the retained storage form, more or less detailed, the number of stored data remains small. Such a simplicity is obtained due to the presentation of the information in a limited number of segments, corresponding to a limited number of discrete values of the first parameter (Vdd). Further, the analysis of the variation curve obtained for different sets of discrete values of the first parameter may be an element for aiding the selection of discrete values of this first parameter.

If, at step 50, target clock frequency $F_{target}$ is in one of ranges $[F_{i-}, F_{i+}]$, for i varying from 1 to N, determined by analysis unit 32, then the method carries on to step 52 where a first control mode, called Mode 1, is implemented. If, at step 50, target clock frequency $F_{target}$ is not in one of ranges $[F_{i-}, F_{i+}]$, for i varying from 1 to N, determined by analysis unit 32, then the method carries on to step 54 where a second control mode, called Mode 2, is implemented.

Figure 8:
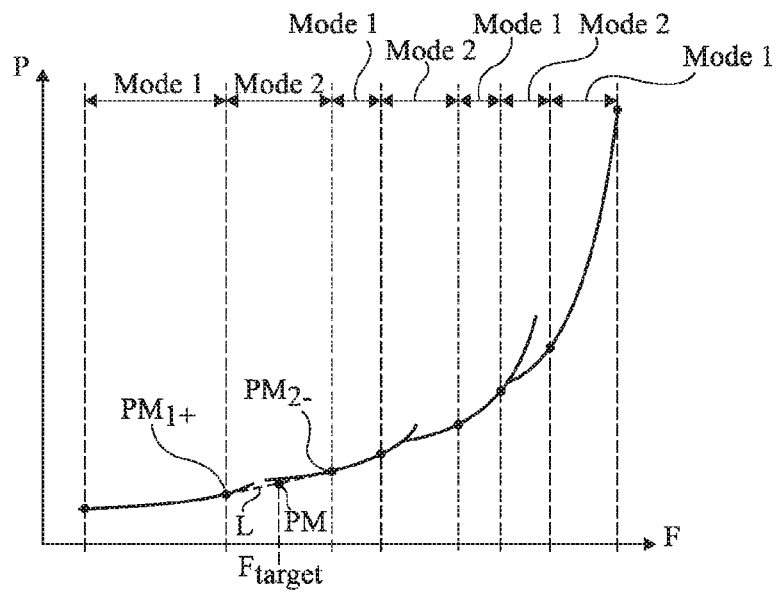
FIG. 8 is a diagram similar to FIG. 5 and illustrates an embodiment of the embodiment of the control method of FIG. 7.

FIG. 8 is a diagram similar to FIG. 5 which further shows the frequency ranges where the first control mode, Mode 1, is implemented and the frequency ranges where the second control mode, Mode 2, is implemented.

At step 52, analysis unit 32 determines the value of bias voltage $V_{bb}$ for which the target clock frequency is obtained based on the data representative of the optimal configurations determined by analysis unit 32. Since point PM at target clock frequency $F_{target}$ belongs to convex envelope $C_H$, the consumed power is minimum. Unit 22 controls actuator 24 to take the clock frequency to target clock frequency $F_{target}$. Unit 22 further controls actuator 26 to take power supply voltage $V_{dd}$ to power supply voltage $V_{dd,i}$ and unit 22 controls actuator 28 to take bias voltage $V_{bb}$ to the determined value. The modifications of the clock frequency, of power supply voltage $V_{dd}$, and of bias voltage $V_{bb}$ are performed to guarantee that there will be no time errors.

At step 54, analysis unit 32 determines at least two clock frequencies $F_{inf}$ and $F_{sup}$ corresponding to points PM belonging to complex envelope $C_H$, clock frequency $F_{inf}$ being smaller than target clock frequency $F_{target}$ and clock frequency $F_{sup}$ being greater than target clock frequency $F_{target}$. According to an embodiment, the selected points PM are the end points of the two arcs of the convex envelope having associated clock frequencies closest to target clock frequency $F_{target}$.

Unit 22 controls actuator 24 to successively take the clock frequency to value $F_{sup}$ for a time period $D_{sup}$ and to value $F_{inf}$ for a time period $D_{inf}$. As a variation, clock frequency $F_{sup}$ may be applied after clock frequency $F_{inf}$. As an example, calling $D_t$ the time taken to execute the task at target clock frequency $F_{target}$, time periods $D_{inf}$ and $D_{sup}$ may be determined according to the following relations (2):

$$Dsup = \alpha Dt$$

$$Dinf = (1-\alpha)Dt$$

$$\alpha = (F\text{target} - Finf)/(Fsup - Finf) \qquad (2)$$

FIG. 8 illustrates an example in the case where target clock frequency $F_{target}$ is located between the abscissas of points $PM_{1+}$ and $PM_{2-}$ respectively corresponding to triplets $(V_{dd,1}, V_{bb,1+}, F_{1+})$ and $(V_{dd,2}, V_{bb,2-}, F_{2-})$.

In this case, the power consumed during the successive application of the values of triplet $(V_{dd,1}, V_{bb,1+}, F_{1+})$ and of the values of triplet $(V_{dd,2}, V_{bb,2-}, F_{2-})$ is minimum. In FIG. 8, this power corresponds to the point at frequency $F_{target}$ belonging to line L shown in dotted lines connecting points $PM_{1+}$ and $PM_{2-}$.

The embodiment previously described in relation with FIG. 8 implies a simultaneous modification of the clock frequency, of power supply voltage $V_{dd}$, and of bias voltage $V_{bb}$. However, according to the type of actuators 22, 24, and 26 used, the passing from a first value to a second value of clock frequency $F_{max}$, of power supply voltage $V_{dd}$, and/or of bias voltage $V_{bb}$ may require a non-negligible transition time.

According to an embodiment, it may be passed from point $PM_{sup}$ to point $PM_{inf}$ via an intermediary point $PM_{int}$. Point $PM_{int}$ is associated with a triplet $(V_{dd}, V_{bb}, F_{max})$ having a component identical to the triplet associated with point $PM_{inf}$ and a component identical to the triplet associated with point $PM_{sup}$. The third component is selected to guarantee that the circuit is functional. Thereby, on passing from point $PM_{sup}$ to point $PM_{int}$, only two parameters are modified. The passing from point $P_{Mint}$ to point $PM_{inf}$ is then obtained by varying the value of the unmodified parameter from the value for point $PM_{sup}$ to the value for point $PM_{inf}$, the third parameter being modified to the value associated with point $PM_{inf}$.

Figure 9:
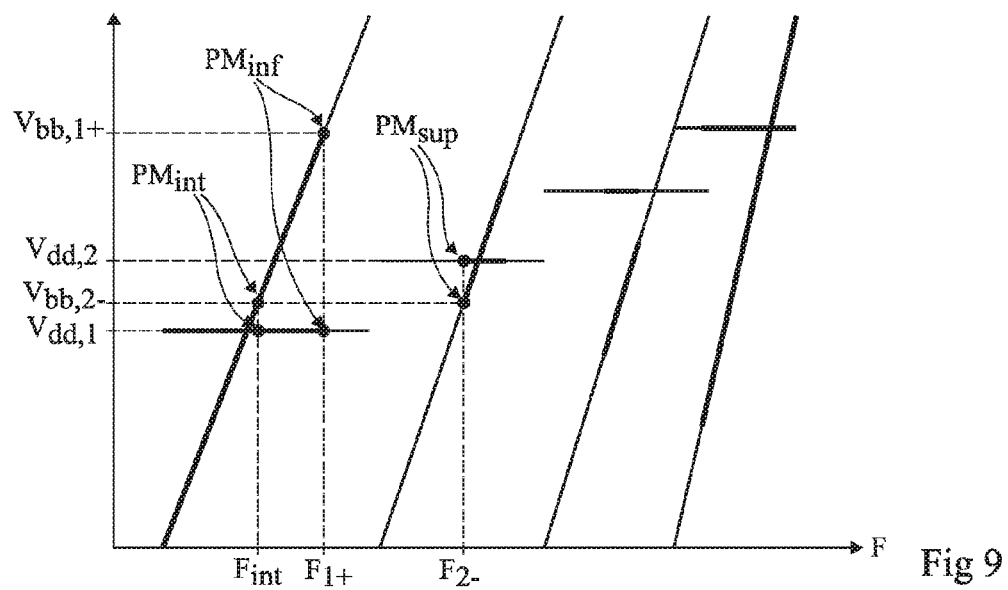
FIG. 9 is a diagram similar to FIG. 6 and illustrates another embodiment of the control method of FIG. 7.

FIG. 9 is similar to FIG. 6 and illustrates such an embodiment in the case where bias voltage $V_{bb}$ is the parameter for which the transition between two values is not instantaneous. Unit 20 controls actuators 22, 24, and 26 to point $PM_{sup}$ associated with triplet $(V_{dd,2}, V_{bb,2-}, F_{2-})$ for a time period $\alpha'D_t$. Unit 20 then controls actuators 22 and 24 to point $PM_{int}$ associated with triplet $(V_{dd,1}, V_{bb,2-}, F_{int})$. Unit 20 then controls actuators 22 and 26 to pass, within a time $\gamma'D_t$, from point $PM_{int}$ to point $PM_{inf}$ by varying the bias voltage from $V_{bb,2-}$ to $V_{bb,1+}$ and by varying the frequency from $F_{int}$ to $F_{1+}$. Time period $\gamma'$ depends on the dynamic range of actuator 26. Circuit 12 is maintained at point $PM_{inf}$ for a time period $\beta'D_t$.

Figure 10:
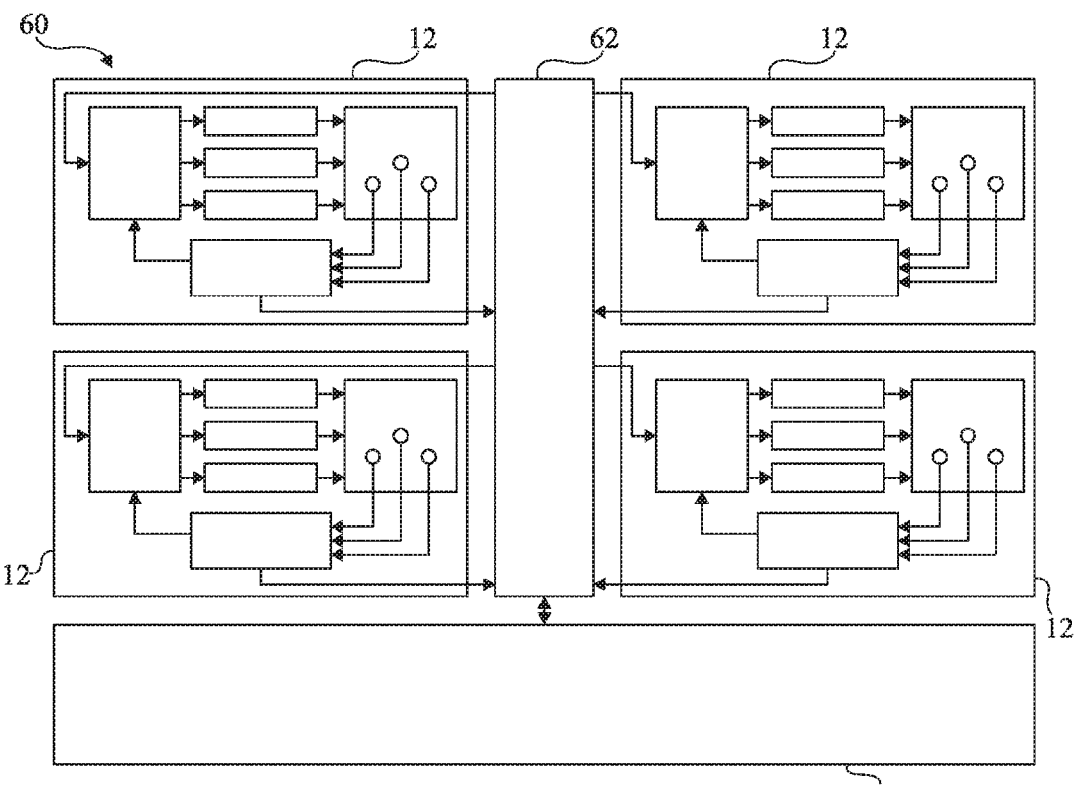
FIG. 10 partially and schematically shows another embodiment of an electronic circuit.

FIG. 10 shows another embodiment of an electronic circuit 60. Electronic circuit 60 comprises all the elements of electronic circuit 10 shown in FIG. 1. Electronic circuit 60 further comprises an interconnection network 62 capable of allowing a data exchange between unit electronic circuits 12. Interconnection network 62 may comprise a data exchange bus or correspond to a network-on-chip. The electronic circuit comprises K elementary electronic circuits 12, K being an integer greater than 1. As an example, in FIG. 10, K is equal to four.

General control unit 14 is capable of allocating the tasks to be executed to the different unit electronic circuits 12. An application comprising M tasks $Task_m$ to be assigned is considered, M being an integer greater than 1 and m being an integer which varies from 1 to M. Each task $Task_m$ has an associated target clock signal $F_{target,m}$ for the execution of this task. The target clock frequencies may be determined by general control unit 14.

General control unit 14 is capable of collecting the data representative of the optimal configurations of each circuit 12. The data representative of the optimal configurations have been determined by each electronic circuit 12 as previously described.

In the case where one of circuits 12 updates its data representative of optimal configurations, the updated data are transmitted to unit 14.

Figure 11:
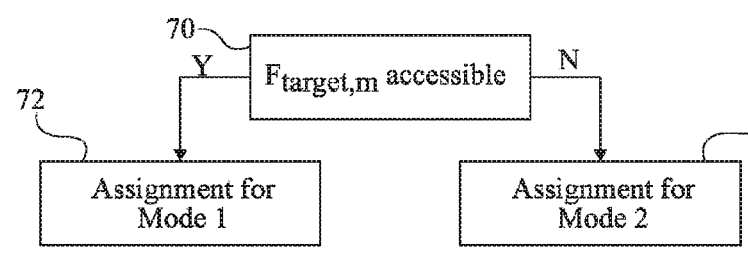
FIG. 11 shows in the form of a block diagram an embodiment of a method of controlling the electronic circuit of FIG. 10.

FIG. 11 shows, in the form of a block diagram, an embodiment of the method of task assignment by general control unit 14. The method is implemented for each task $Task_m$ to be executed.

At step 70, general control unit 14 determines whether target clock frequency $F_{target,m}$ of task $Task_m$ is contained in one of the accessible frequency ranges $[F_{i-}, F_{i+}]$ of one of electronic circuits 12. If target clock frequency $F_{target,m}$ is contained in one of the accessible frequency ranges $[F_{i-},F_{i+}]$ of one of electronic circuits 12, unit 14 selects this circuit 12 if the latter is not already executing a task and the method carries on to step 72. If target clock frequency $F_{target,m}$ is not contained in one of the accessible frequency ranges $[F_{i-}, F_{i+}]$ of one of electronic circuits 12, general control unit 14 selects the available electronic circuit 12 for which the consumed power is the lowest by applying previously-described control mode Mode 2 and the method carries on to step 74.

At step 72, unit 14 assigns task $Task_m$ to the selected electronic circuit 12 and transmits target clock frequency $F_{target,m}$ to the selected electronic circuit 12. The selected circuit 12 then implements a control method of Mode 1 type such as previously described.

At step 74, unit 14 assigns task $Task_m$ to the selected electronic circuit 12 and transmits target clock frequency $F_{target,m}$ to the selected electronic circuit 12. The selected circuit 12 then implements a control method of Mode 2 type such as previously described.

Specific embodiments have been described. Various alterations and modifications will occur to those skilled in the art. Although, in the previously described embodiments, the used operating parameters of the electronic circuit are the clock frequency, the power supply voltage, and the transistor bulk bias voltage, other operating parameters may be used. As an example, a parameter representative of the operating speed of the electronic circuit, other than the clock frequency, may be used. In particular, in the case of an electronic circuit implementing a hard disk data storage system, the rotation speed of the hard disk may be used as an operating parameter.

Although embodiments where the discrete operating parameter is the electronic circuit power supply voltage have been described, another discrete operating parameter may be used. Indeed, considering the electronic circuit 60 shown in FIG. 10, the rank, or number, of circuit 12 to which the task is assigned may be the discrete operating parameter of circuit 60. An actuator of such an operating parameter is then capable of having a circuit 12 execute a task initially executed by another circuit 12. The use of the rank as an operating parameter is particularly advantageous in the case where circuits 12 have different performances, for example, in terms of power consumption and operating speed. The two other following continuously-varying operating parameters may further be used: the clock frequency of each circuit 12 and the bulk bias voltage of MOS transistors of each circuit 12 or the power supply voltage of each circuit 12 in the case of a power supply voltage varying continuously, or discretely with a fine pitch, or discretely.

Further, the target operating parameter may be a voltage, for example, the power supply voltage delivered by a battery. In this case, it could be desired to adapt the operating parameters, for example, the operating frequency, to optimize a performance criterion, such as the circuit power consumption. In this case, one may have, as first, second, and third operating parameters, respectively, bulk bias voltage $V_{bb}$, the circuit frequency, and the circuit power supply voltage. There would then be variation ranges of minimum power supply voltage according to frequency for a given bias voltage value.

Further, it could be desired to optimize a performance criterion other than an energetic performance criterion (power, energy . . . ), for example a circuit temperature, heating, or aging criterion.

Further, in the previously-described embodiments, envelope $C_H$ of the data representative of the performance criterion is always increasing (for example, for the power according to the maximum frequency, shown in FIG. 4) or always decreasing (taking, for example, the energy according to the clock period). In the case where an increasing and then decreasing envelope, or conversely, according to the third parameter, would be obtained, it is most likely that one part of the configurations associated with the decreasing or increasing portion is sub-optimal as compared with the other part. In this case, an only increasing or only decreasing portion of the envelope will be kept in practice. As an example, considering that the third parameter is the clock period of the circuit (1/frequency) and that the variation curve is the energy versus the period, it is then highly possible for the convex envelope to be either decreasing, or increasing. In this case, it can be observed that the static power consumption becomes preponderating over the dynamic power consumption when the period becomes too long (the frequency becomes too small) and it will be more judicious to operate the circuit at relatively low frequencies, corresponding to the decreasing portion of the envelope (with the optional possibility of setting the circuit to standby if the execution of the tasks has ended faster than requested).

Further, it will readily occur to those skilled in the art that the range of useful values of the third parameter will be limited and between minimum and maximum values of the third parameter capable of corresponding to the retained configurations so that the analysis method develops properly.

The invention claimed is:

1. A method of analyzing an electronic circuit enabling to determine optimal operating configurations of the electronic circuit according to a given performance criterion, each operating configuration of the electronic circuit being defined by values taken by first, second, and third operating parameters, the first parameter being capable of taking first discrete values, the second and third parameters being capable of continuously or discretely varying, the second parameter being capable of varying between a minimum value and a maximum value, each pair of a first value of the first parameter and of a second value of the second parameter having an associated third limiting value of the third parameter beyond which the circuit may no longer operate, the method comprising the steps of:
   a) determining, for each value of the first parameter, a limiting variation range of the third parameter by varying the second parameter between the minimum and maximum values of this second parameter and by searching the third corresponding limiting values of the third parameter; and
   b) determining, for each value of the first parameter, an optimal variation range of the third parameter corresponding to all or part of said limiting variation range of the third parameter previously determined for the value of the first considered parameter, so that the optimal variation ranges selected for the different values of the first parameter are all different.

2. The method of claim 1, further comprising an additional step c) between steps a) and b), step c) comprising determining a curve of variation of data representative of said performance criterion according to the third parameter, by defining, for each first value of the first parameter, an arc of a curve corresponding to the values of said representative data obtained over the limiting variation range of the third parameter associated with the first considered parameter and the corresponding variation range of the second parameter and wherein, at step b), for each value of the first parameter, an optimal variation range of the third parameter corresponding to all or part of said limiting variation range of the third parameter previously determined for the value of the first considered parameter is determined, so that the optimal variation ranges selected for the different values of the first parameter are all different and so that the portions of arc of a curve associated with the selected optimal variation ranges meet at best the performance criterion of the electronic circuit for the corresponding values of the third parameter.

3. The method of claim 2, wherein step c) comprises the steps of:
   determining the convex or concave envelope of said variation curve; and
   searching for the portions of said limiting variation ranges of the third parameter which correspond to said envelope and retaining these portions as optimal variation ranges.

4. A method of controlling an electronic circuit enabling to determine an optimal operating configuration of the electronic circuit according to a given performance criterion, each operating configuration of the electronic circuit being defined by given values of first, second, and third operating parameters, the first parameter being capable of taking first discrete values, the second and third parameters being capable of continuously or discretely varying, the electronic circuit comprising means for storing information previously obtained by the method of claim 1 and comprising, for each value of the first parameter, an optimal variation range of the third parameter associated with a corresponding range of values of the second parameter, the optimal variation ranges all being different, the electronic circuit comprising analysis means enabling, for each pair of one of the first values of the first parameter and of a second value of the second parameter, to associate therewith a third value of the third parameter, the method comprising the steps of:
   d) determining a target value of the third parameter;
   e) if the target value is located in one of the optimal variation ranges of the third parameter, selecting this optimal variation range and having the electronic circuit operate by taking the third parameter to the target value; and
   f) in the opposite case, selecting the two ranges of optimal values of the third parameter closest to the target value on either side thereof and having the electronic circuit operate by successively taking the third parameter into each of the two selected optimal variation ranges, between a lower value and an upper value of the third parameter on each side of the target value; and
   wherein, at steps e) or f), the first parameter is taken to the first value corresponding to the range containing the third applied value and the second parameter is taken to the second value of the pair associated with the third applied value.

5. The method of claim 1, wherein said given performance criterion is an energetic criterion and the third parameter is representative of a time performance criterion.

6. The method of claim 4, wherein the target value is determined for the execution of a task by the electronic circuit within a given time.

7. The method of claim 4, comprising, at step f), a first operation of the electronic circuit for a first time period by taking the third parameter to said lower value, and a second operation of the electronic circuit for a second time period by taking the third parameter to said upper value, the first and second operations being alternately repeated.

8. The method of claim 1, wherein the first parameter is the power supply voltage of the electronic circuit, the second parameter is the bias voltage of metal-oxide field effect transistors of the electronic circuit, and the third parameter is the clock frequency at which the electronic circuit is rated.

9. The method of claim 3, for controlling a plurality of electronic circuits, comprising the steps of:
   if the target value is located in one of the ranges of one of the electronic circuits, having said electronic circuit operate by taking the third parameter to the target value; and
   in the opposite case, selecting one of the electronic circuits and, for said electronic circuit, selecting the two ranges closest to the target value on either side thereof and having said electronic circuit operate by successively taking the third parameter into each of the two selected ranges.

10. The method of claim 1, wherein the electronic circuit comprises at least two electronic circuit sections, a rank being assigned to each electronic circuit section, and wherein the first parameter is said rank.

11. An electronic circuit comprising:
   actuators enabling to control the values of first, second, and third parameters defining an operating configuration of the electronic circuit, the first parameter being capable of taking first discrete values, the second and third parameters being capable of continuously or discretely varying;
   a first unit comprising means for storing information previously obtained according to the method of claim 1 and comprising, for each value of the first parameter, an optimal variation range of the third parameter associated with a corresponding range of values of the second parameter, the optimal variation ranges all being different, and comprising analysis means connected to the storage means and enabling to associate a third value of the third parameter to each pair of one of the first values of the first parameter and of a second value of the second parameter;
   a second unit capable of determining a target value of the third parameter;
   a third analysis unit capable of determining whether the target value is located in one of the optimal variation ranges, and of selecting this range in the case where it is and, in the opposite case, of selecting the two ranges closest to the target value on either side thereof, the analysis unit defining according to the case one or two operating configurations with a third parameter respectively having the target value or two values respectively smaller and greater than said target value and respectively belonging to the two selected ranges, for each configuration the first parameter taking a first value corresponding to the range containing the value of the third parameter and the second parameter taking the second value of the pair associated with the third selected value; and
   a fourth control unit capable of applying, via said actuators, an operating configuration or, as a variation, each of the two operating configurations defined by the third analysis unit.

12. An electronic circuit comprising:
   actuators enabling to control the values of first, second, and third parameters defining an operating configuration of the electronic circuit, the first parameter being capable of taking first discrete values, the second and third parameters being capable of continuously or discretely varying;

a first unit comprising means for storing information previously obtained according to the method of claim 1 and comprising, for each value of the first parameter, an optimal variation range of the third parameter associated with a corresponding range of values of the second parameter, the optimal variation ranges all being different, and comprising analysis means connected to the storage means and enabling to associate a third value of the third parameter to each pair of one of the first values of the first parameter and of a second value of the second parameter;

a second unit capable of determining a target value of the third parameter;

a third analysis unit capable of determining whether the target value is located in one of the optimal variation ranges, and of selecting this range in the case where it is and, in the opposite case, of selecting the two ranges closest to the target value on either side thereof, the analysis unit defining according to the case one or two operating configurations with a third parameter respectively having the target value or two values respectively smaller and greater than said target value and respectively belonging to the two selected ranges, for each configuration the first parameter taking a first value corresponding to the range containing the value of the third parameter and the second parameter taking the second value of the pair associated with the third selected value; and a fourth control unit capable of applying, via said actuators, an operating configuration or, as a variation, each of the two operating configurations defined by the third analysis unit, wherein the first unit comprises means for implementing the analysis method of claim 1 enabling to define said information stored by said storage means.

13. An electronic circuit comprising:

actuators enabling to control the values of first, second, and third parameters defining an operating configuration of the electronic circuit, the first parameter being capable of taking first discrete values, the second and third parameters being capable of continuously or discretely varying;

a first unit comprising means for storing information previously obtained according to the method of claim 2 and comprising, for each value of the first parameter, an optimal variation range of the third parameter associated with a corresponding range of values of the second parameter, the optimal variation ranges all being different, and comprising analysis means connected to the storage means and enabling to associate a third value of the third parameter to each pair of one of the first values of the first parameter and of a second value of the second parameter;

a second unit capable of determining a target value of the third parameter;

a third analysis unit capable of determining whether the target value is located in one of the optimal variation ranges, and of selecting this range in the case where it is and, in the opposite case, of selecting the two ranges closest to the target value on either side thereof, the analysis unit defining according to the case one or two operating configurations with a third parameter respectively having the target value or two values respectively smaller and greater than said target value and respectively belonging to the two selected ranges, for each configuration the first parameter taking a first value corresponding to the range containing the value of the third parameter and the second parameter taking the second value of the pair associated with the third selected value; and a fourth control unit capable of applying, via said actuators, an operating configuration or, as a variation, each of the two operating configurations defined by the third analysis unit, wherein the first unit comprises means for implementing the analysis method of claim 2 enabling to define said information stored by said storage means.

* * * * *